United States Patent
Behzad

(10) Patent No.: US 7,135,928 B2
(45) Date of Patent: *Nov. 14, 2006

(54) METHOD FOR TRANSCONDUCTANCE LINEARIZATION FOR DC-COUPLED APPLICATIONS

(75) Inventor: Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/769,178

(22) Filed: Jan. 30, 2004

(65) Prior Publication Data

US 2004/0183598 A1 Sep. 23, 2004

Related U.S. Application Data

(60) Provisional application No. 60/443,594, filed on Jan. 30, 2003.

(51) Int. Cl.
*H03F 3/45* (2006.01)

(52) U.S. Cl. .................. 330/261; 330/253; 330/285; 330/295; 330/296

(58) Field of Classification Search ................ 330/261, 330/285, 295–296, 298, 310, 311
See application file for complete search history.

(56) References Cited

U.S. PATENT DOCUMENTS

| | | | |
|---|---|---|---|
| 5,079,515 A * | 1/1992 | Tanimoto ................. 330/256 |
| 6,181,204 B1 * | 1/2001 | Smith et al. ................. 330/261 |
| 6,188,281 B1 * | 2/2001 | Smith et al. ................. 330/252 |
| 6,489,848 B1 * | 12/2002 | Smith et al. ................. 330/261 |
| 6,496,067 B1 * | 12/2002 | Behzad et al. ............. 330/261 |
| 6,518,839 B1 * | 2/2003 | Gibson et al. ................. 330/51 |

* cited by examiner

*Primary Examiner*—Rexford Barnie
*Assistant Examiner*—Khai M. Nguyen
(74) *Attorney, Agent, or Firm*—Garlick Harrison & Markison; James A. Harrison

(57) ABSTRACT

A Class AB voltage-to-current converter includes a plurality of DC coupled transconductance stages that produce a linearized output and a biasing circuit. The biasing circuit generates a primary bias voltage that is greater than a generated secondary bias voltage. As such, the first transconductance stage becomes active before the second transconductance stage with respect to the magnitude of a differential input voltage, thereby allowing the transconductance of the secondary transconductance stage to be added (or subtracted) from the transconductance of the primary stage to improve the overall transconductance of the Class AB voltage-to-current converter. As each of the plurality of transconductance stages is biased differently from the others, the various transconductance stages are biased on to differing amounts based upon the biasing signals as well as the input signal.

14 Claims, 9 Drawing Sheets network 10 radio 60 direct conversion radio transceiver 100
with linearized transconductance class AB voltage-to-current converter 150

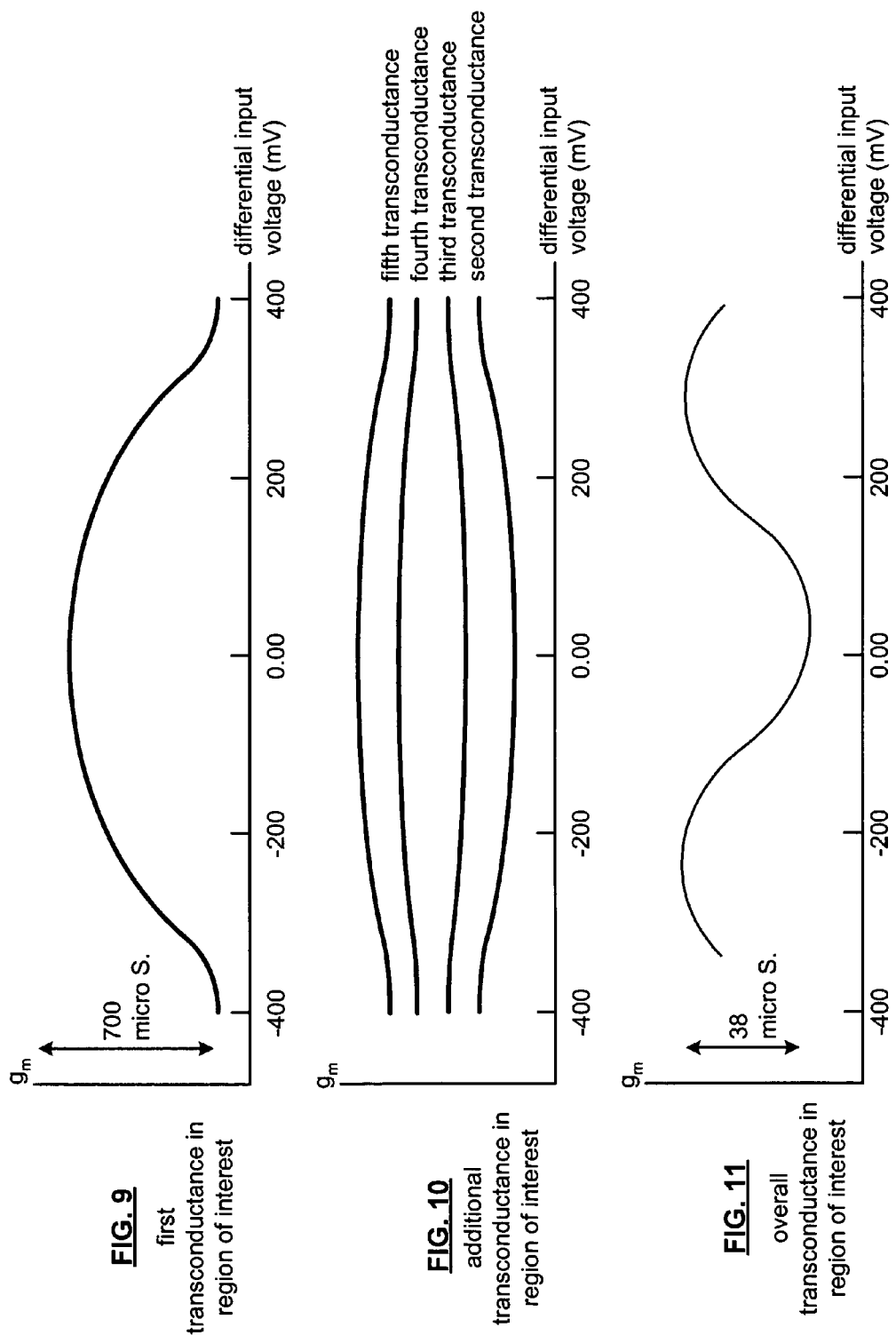

transconductance stage for class AB amplifier 200 mixer module 400

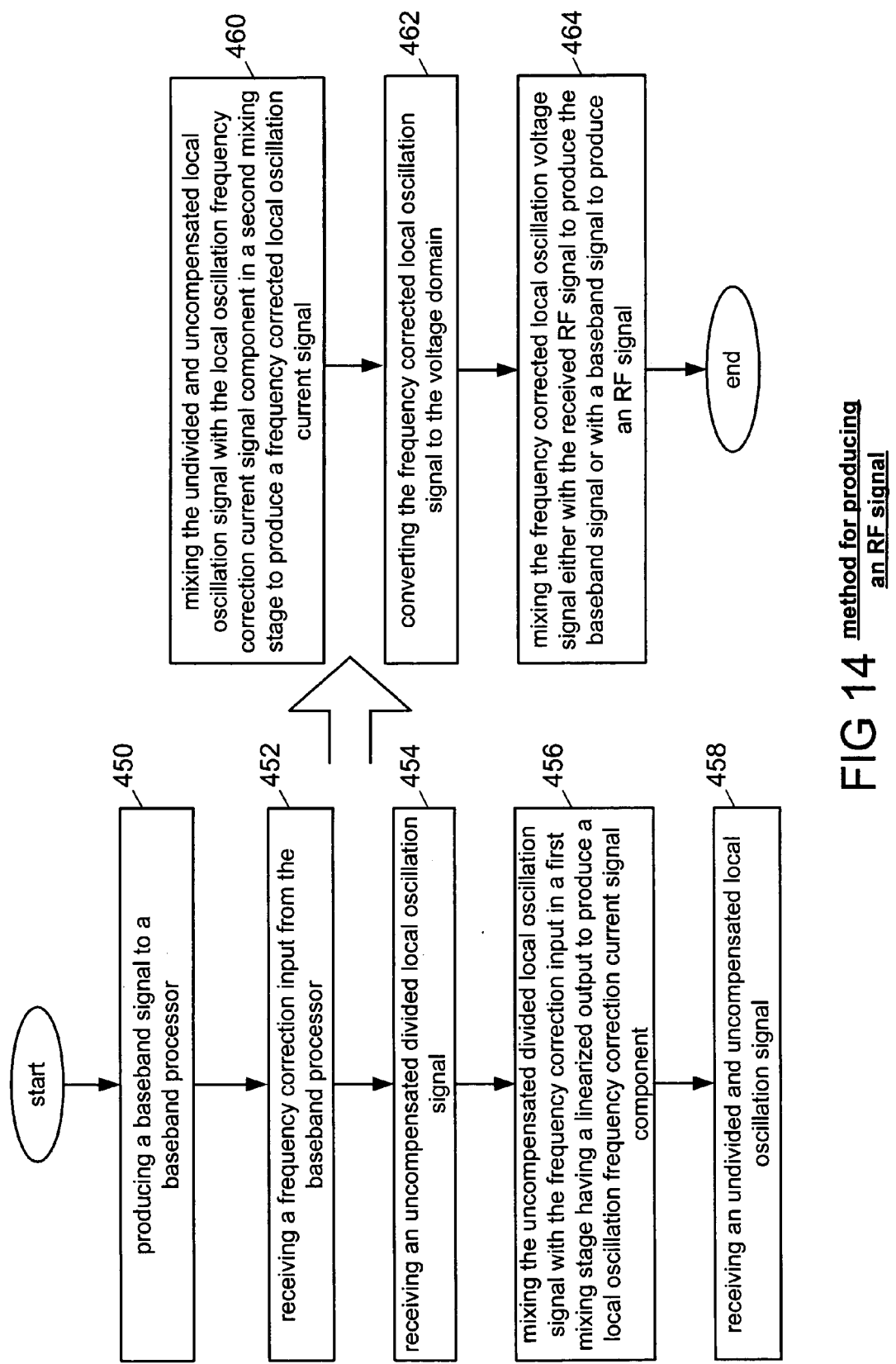
FIG 14 method for producing an RF signal

METHOD FOR TRANSCONDUCTANCE LINEARIZATION FOR DC-COUPLED APPLICATIONS

CROSS REFERENCE TO RELATED APPLICATION

This application claims priority to U.S. Provisional Application Ser. No. 60/443,594, filed Jan. 30, 2003, which is incorporated herein by reference in its entirety for all purposes.

BACKGROUND OF THE INVENTION

1. Field of the Invention

This invention relates generally to analog circuitry and more particularly to operational amplifiers.

2. Background of the Invention

Operational amplifiers are known to be used in a wide variety of applications. For instance, operational amplifiers may be used as buffers, amplifiers, power amplifier drivers, etc., and are used in such forms in an almost endless list of electronic devices. For example, operational amplifiers are readily used in radio devices, televisions, telephones, wireless communication devices, entertainment equipment, etc.

When an operational amplifier is employed as a power amplifier driver, it is typically required to drive heavy loads (e.g., 50 Ohms) with a reasonably small amount of power consumption, perform linearly, and provide a desired level of gain. Often, the linearity of a power amplifier driver is determined by the linearity of its voltage-to-current converter (i.e., the transconductance (gm) stage). Given a fixed amount of current, a differential pair of amplifiers' linear performance increases by increasing the amount of its $V_{gs} - V_t$ ($=V_{gt}$). One of average skill in the art readily appreciates that increasing channel length of a field effect transistor further increases $V_{gt}$. However, this results in lower gain for a given bias current and is also subject to velocity saturation limits.

Many schemes have been traditionally used to linearize a transconductance stage as compared to that obtained from a standard differential pair, which is shown in FIG. 1. As shown, the transconductance stage includes a pair of transistors operably coupled to receive a differential input voltage and, based on the current provided by the current source, produces a differential output current. However, the linearization of the transconductance stage shown in FIG. 1 is limited.

FIG. 2 illustrates a transconductance stage that improves linearity, with respect to the transconductance stage of FIG. 1. In this implementation, resistors are added in series with the input transistors. The resistors increase the linear operational range of an amplifier through the local series feedback. This improvement, however, is at the expense of reduced gain, reduced headroom, and increased noise. One solution that has been recognized heretofore is to compensate for the reduction in gain by adding additional transconductance stages. This approach, however, consumes more current, integrated circuit real estate and consumes more power.

FIG. 3 illustrates an alternate transconductance stage that includes inductors in series with the input transistors. This transconductance stage is an improvement over the transconductance stage of FIG. 2 in that it requires less operating voltage and does not contribute extra noise to the output current. However, it still has an effective reduction of the gain and works over a narrow frequency range.

FIG. 4 illustrates yet another known implementation of a transconductance stage. In this instance, the input transistors are operably coupled to an effective ground wherein the inputs are AC coupled and biased to a particular bias voltage. The implementation of FIG. 4 results in a fundamentally different large signal transfer function in contrast to the large signal transfer functions for the circuitry of the differential pair amplifiers illustrated in FIGS. 1 through 3. This transfer function is typically more linear in nature and requires less headroom than that of a standard differential pair and further has no degeneration noise penalties. However, this circuit in FIG. 4 provides a limited amount of improvement in linearity performance as compared to that of the differential pairs of FIGS. 1 through 3. Such limited linearity in many systems is unacceptable for many applications.

Therefore, a need exists for a DC coupled transconductance stage that operates from low supply voltages, has good noise performance, and has good linearity performance.

SUMMARY OF THE INVENTION

A Class AB voltage-to-current converter includes a plurality of DC coupled transconductance stages that produce a linearized output and a biasing circuit. The biasing circuit generates a primary bias voltage that is greater than a generated secondary bias voltage. As such, the first transconductance stage becomes active before the second transconductance stage with respect to the magnitude of a differential input voltage, thereby allowing the transconductance of the secondary transconductance stage to be added (or subtracted) from the transconductance of the primary stage to improve the overall transconductance of the Class AB voltage-to-current convert. As each of the plurality of transconductance stages is biased differently from the others, the various transconductance stages are biased on to differing amounts based upon the biasing signals as well as the input signal.

The transconductance block, in one described embodiment, includes up to five transconductance stages that are DC coupled to an input and to the biasing circuitry but are all biased differently from one another. Accordingly, for a voltage range of interest, each transconductance stage produces a different level of output current based upon its bias signal and upon an instantaneous value of the input signal. The output currents from each of the transconductance stages are then summed to produce an output transconductance block signal that is linearized.

BRIEF DESCRIPTION OF THE DRAWINGS

FIGS. 9 through 11 illustrate a graphical representation of the operation of the Class AB voltage-to-current converter of FIG. 5;

FIG. 14 is a flowchart that illustrates a method for producing an RF signal according to one embodiment of the invention.

DETAILED DESCRIPTION OF A PREFERRED EMBODIMENT

Figure 1:
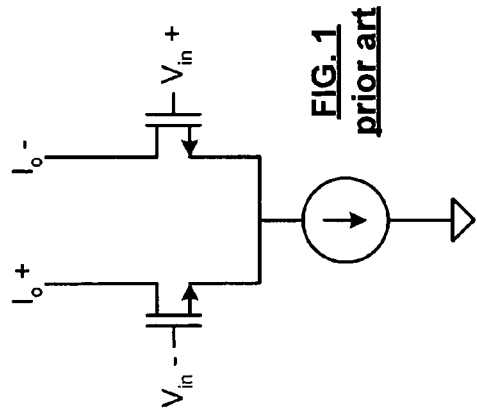
FIG. 1 illustrates a schematic block diagram of a prior art transconductance stage.
Figure 2:
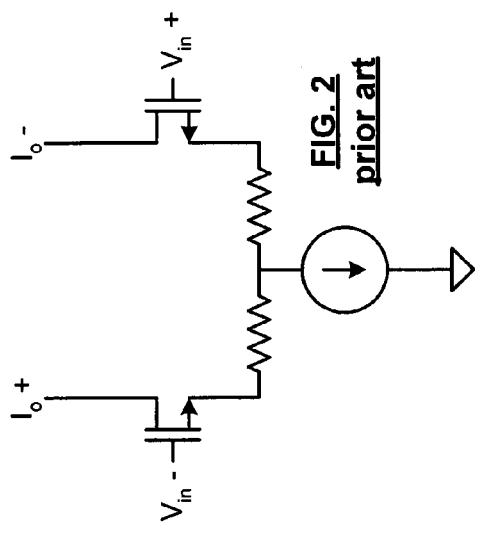
FIG. 2 illustrates a schematic block diagram of an alternate prior art transconductance stage.
Figure 3:
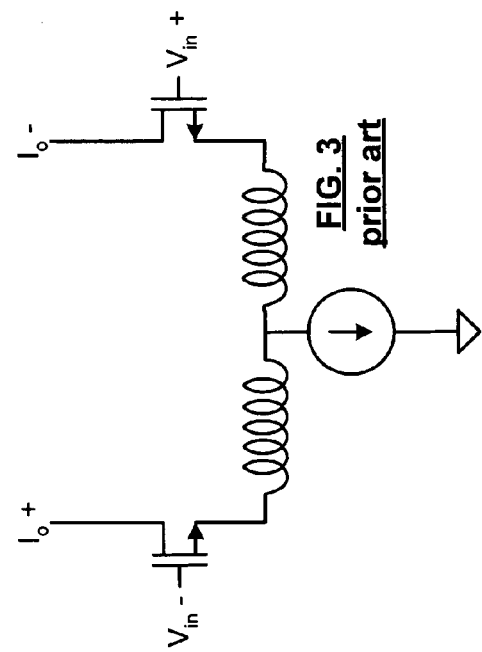
FIG. 3 illustrates a schematic block diagram of another prior art transconductance stage.
Figure 4:
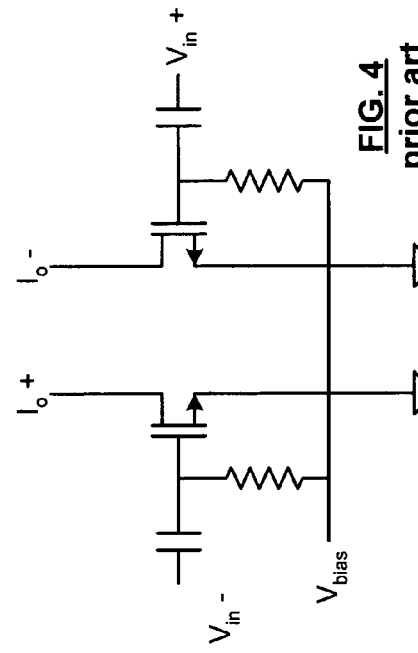
FIG. 4 illustrates a schematic block diagram of yet another prior art transconductance stage.
Figure 5:
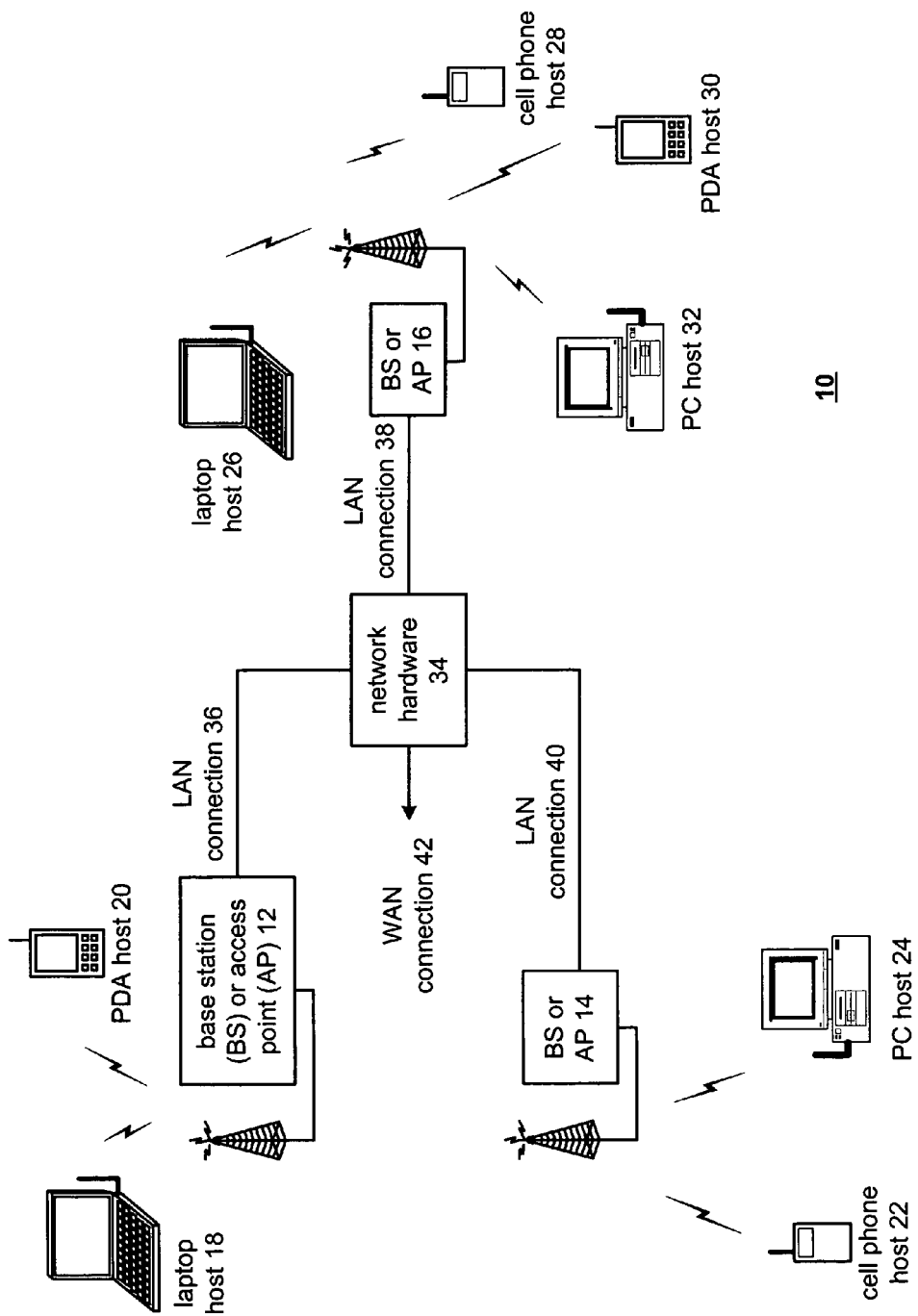
FIG. 5 is a functional block diagram illustrating a communication system that includes a plurality of base stations or access points, a plurality of wireless communication devices and a network hardware component that include linearized transconductance modules formed according to one embodiment of the invention.

FIG. 5 is a functional block diagram illustrating a communication system 10 that includes a plurality of base stations or access points (AP) 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 6.

The base stations or access points 12–16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10. Each of the base stations or access points 12–16 has an associated antenna or antenna array to communicate with the wireless communication devices in its area. Typically, the wireless communication devices 18–32 register with the particular base station or access points 12–16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 6:
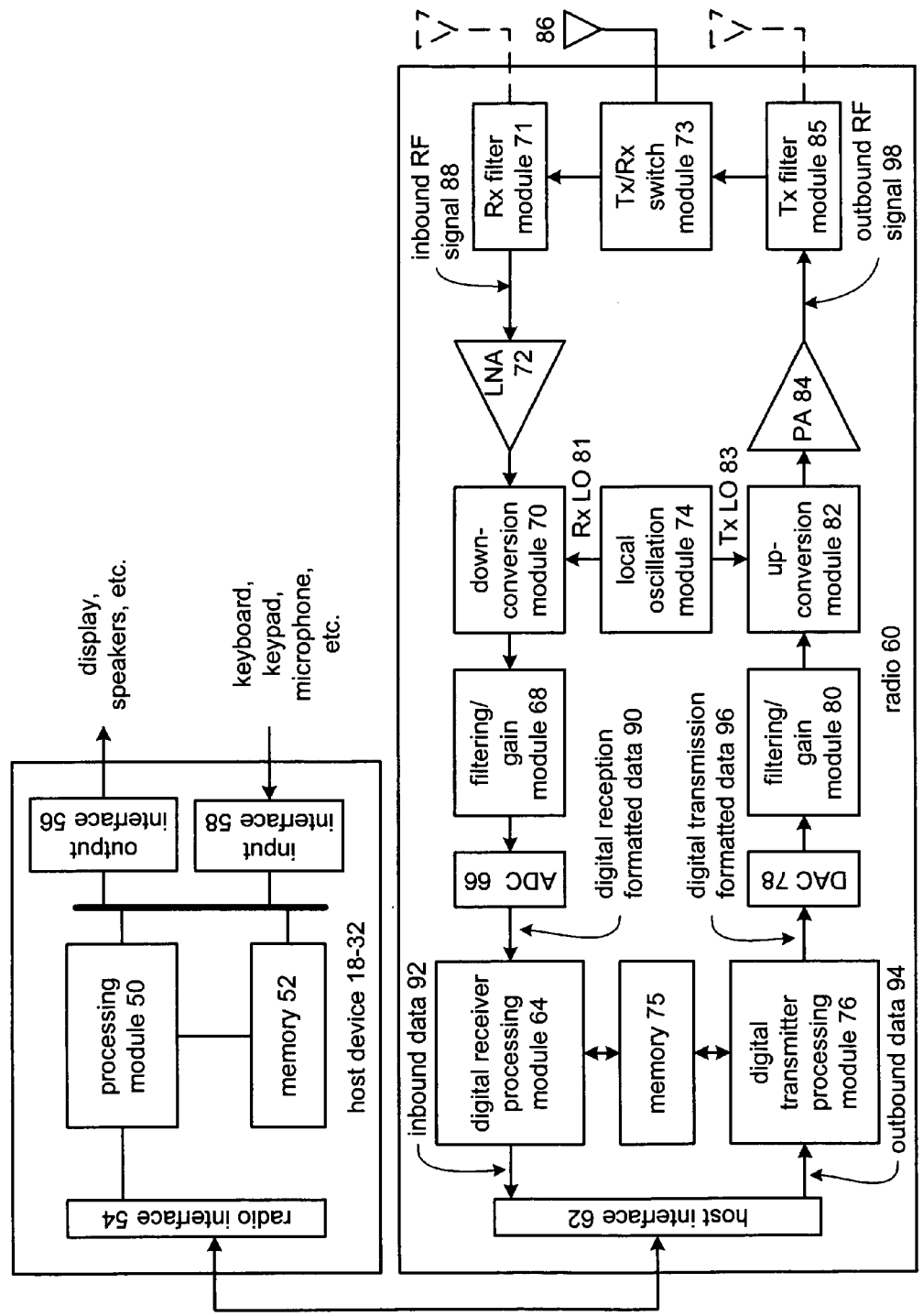
FIG. 6 is a schematic block diagram illustrating a wireless communication device as a host device and an associated radio with linearized transconductance modules according to one embodiment of the invention.

FIG. 6 is a schematic block diagram illustrating a wireless communication device 18–32 as a host device and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host wireless communication device 18–32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/RX) switch module 73, a local oscillation module 74, a memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 is shared by the transmit and receive paths as regulated by the Tx/Rx switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and/or modulation. The digital receiver and transmitter processing modules 64 and 76 may be implemented using a shared processing device, individual processing devices, or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18–32 via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an RF signal based on a transmitter local oscillation 83 provided by local oscillation module 74. Local oscillation module 74 is, in one embodiment of the invention, a multi-stage mixer as described herein. The power amplifier 84 amplifies the RF signal to produce an outbound RF signal 98, which is filtered by the transmitter filter module 85. The antenna 86 transmits the outbound RF signal 98 to a targeted device, such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. Local oscillation module 74 is, in one embodiment of the invention, a multi-stage mixer as described herein. The down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18–32 via the radio interface 54.

As one of average skill in the art will appreciate, the wireless communication device of FIG. 6 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver processing module 64 and the digital transmitter processing module 76 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

The wireless communication device of FIG. 6 is one that may be implemented to include either a direct conversion from RF to baseband and baseband to RF or for a conversion by way of a low intermediate frequency. In either implementation, however, for up-conversion module 82 and down-conversion module 70, it is required to provide accurate frequency conversion. For the down-conversion module 70 and up-conversion module 82 to accurately mix a signal, however, it is important that the local oscillation module 74 provide an accurate local oscillation signal for mixing with the baseband or RF by the up-conversion module 82 and down-conversion module 70, respectively. Accordingly, the local oscillation module 74 includes circuitry for adjusting an output frequency of a local oscillation signal provided therefrom. As will be explained in greater detail, below, the local oscillation module 74 includes a multi-stage that receives a frequency correction input that it uses to adjust an output local oscillation signal to produce a frequency corrected local oscillation signal output. While one embodiment of the present invention includes local oscillation module 74, up-conversion module 82 and down-conversion module 70 that are implemented to perform direct conversion between baseband and RF, it is understand that the principles herein may also be applied readily to systems that implement an intermediate frequency conversion step at a low intermediate frequency.

Figure 7:
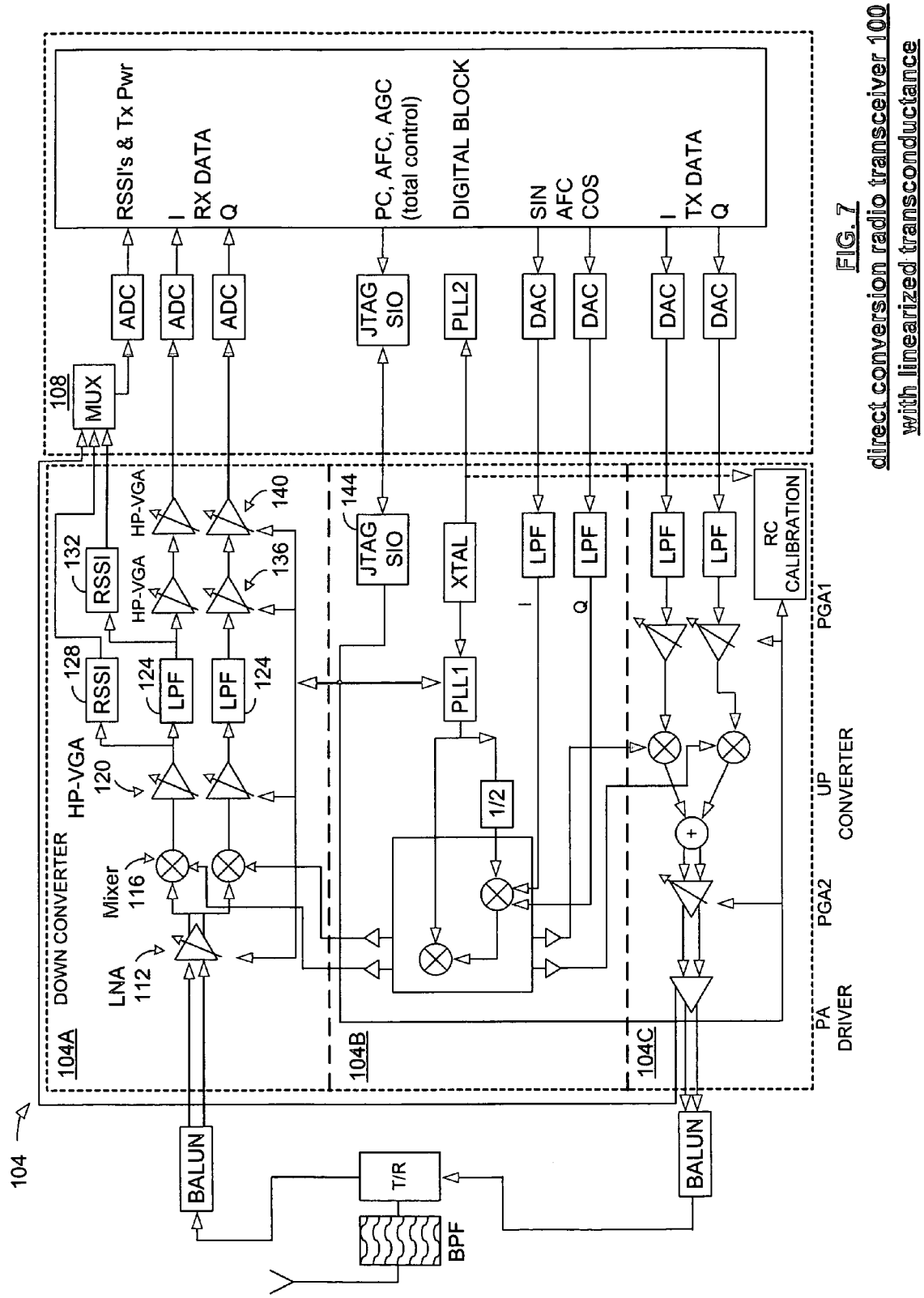
FIG. 7 is a functional schematic diagram of a direct conversion radio transceiver that includes one embodiment of a transconductance module of the present invention.

FIG. 7 is a functional schematic diagram of a direct conversion radio transceiver that includes one embodiment of the present invention. Accordingly, the circuit of FIG. 7 merely represents but one application for a transconductance stage having a linearized response. As will be described in more detail, the radio transceiver of FIG. 7 as well as FIG. 6, includes mixer circuitry that include transconductance stages for upconverting and downconverting radio signals. The present invention may be utilized in such transconductance stages. It is understood, of course, that the circuits and devices within the network of FIGS. 5–7 are exemplary and that the invention may readily be applied in any circuit having a transconductance module.

Referring now to FIG. 7, a transceiver system comprises radio circuitry 104 that is coupled to baseband processing circuitry 108. The radio circuitry 104 performs filtering, amplification, frequency calibration (in part) and frequency conversion (down from the RF to baseband and up from baseband to the RF). Baseband processing circuitry 108 performs the traditional digital signal processing in addition to partially performing the automatic frequency control. As may be seen, the single chip radio circuitry 104 is coupled to receive radio signals that are initially received by the transceiver and then converted by a Balun signal converter, which performs single end to differential conversion for the receiver (and differential to single end conversion for the transmitter end). The Balun signal converters are shown to be off chip in FIG. 7, but they may be formed on-chip with radio circuitry 104 as well. Similarly, while the baseband processing circuitry 108 is shown off-chip, it also may be formed on-chip with radio circuitry 104.

Radio circuitry 104 and, more particularly, circuitry portion 104A, includes a low noise amplifier 112 that is coupled to receive RF signals from a transceiver port. The low noise amplifier 112 then produces an amplified signal to mixers 116 that are for adjusting and mixing the RF with a local oscillation signal. The outputs of the mixers 116 (I and Q components of quadrature phase shift keyed signals) are then produced to a first HP-VGA 120.

The outputs of the first HP-VGA 120 are then produced to a first RSSI 128 as well as to a low pass filter 124. The outputs of the low pass filter 124 are then produced to a second RSSI 132, as well as to a second HP-VGA 136 and a third HP-VGA 140 as maybe seen in FIG. 7.

In operation, the first RSSI 128 measures the power level of the signal and interference. The second RSSI 132 measures the power level of the signal only. The baseband processing circuitry 108 then determines the ratio of the RSSI measured power levels to determine the relative gain level adjustments of the front and rear amplification stages. In the described embodiment of the invention, if the power level of the signal and interference is approximately equal to or slightly greater than the power level of the signal alone, then the first amplification stages are set to a high value and the second amplification stages are set to a low value. Conversely, if the power level of the signal and interference is significantly greater than the power of the signal alone, thereby indicating significant interference levels, the first amplification stages are lowered and the second amplification stages are increased proportionately.

Circuitry portion 104B includes low pass filters for filtering I and Q component frequency correction signals and mixer circuitry for actually adjusting LO signal frequency. The operation of mixers and phase locked loop for adjusting frequencies is known. In the described embodiment of the invention, however, one exemplary embodiment of the invention is found within the mixer circuitry 104B to provide a linearized and low noise transconductance block for upconverting and down converting between RF and IF or RF and baseband. Circuitry portion 104B further includes JTAG (Joint Test Action Group, IEEE 1149.1 boundary-scan standard) serial interface (SIO) circuitry 144 for transmitting control signals and information to circuitry portion 104A (e.g., to control amplification levels) and to a circuitry portion 104C (e.g., to control or specify the desired frequency for the automatic frequency control).

A portion of the automatic frequency control circuitry that determines the difference in frequency between a specified center channel frequency and an actual center channel frequency for a received RF signal is formed within the baseband circuitry in the described embodiment of the invention. This portion of the circuitry includes circuitry that coarsely measures the frequency difference and then measures the frequency difference in the digital domain to obtain a more precise measurement and to produce frequency correction inputs to circuitry portion 104B.

Finally, radio circuitry portion 104C includes low pass filtration circuitry for removing any interference that is present after baseband processing as well as amplification, mixer and up-converter circuitry for preparing a baseband signal for transmission at the RF.

Figure 8:
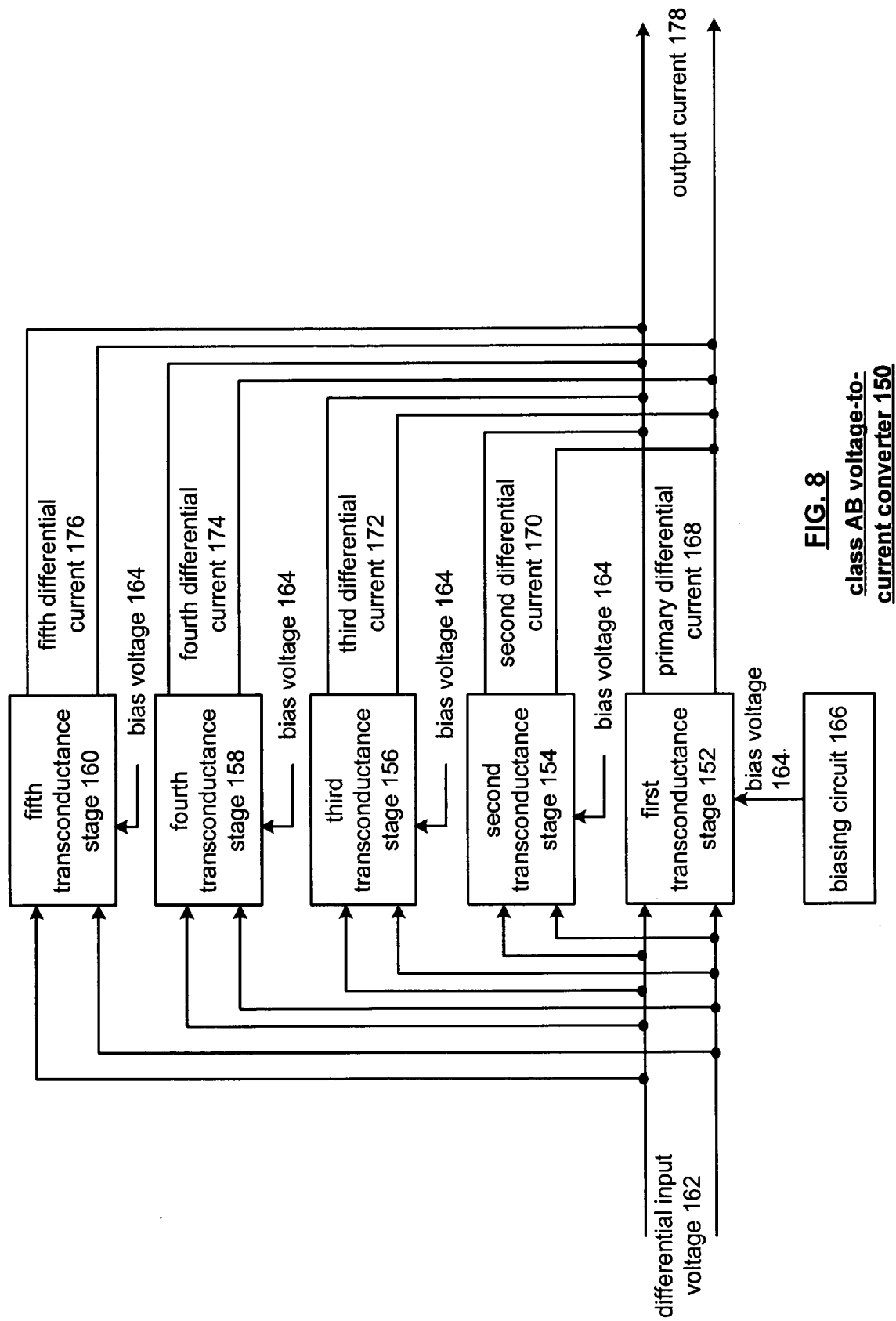
FIG. 8 illustrates a schematic block diagram of a Class AB voltage-to-current converter in accordance with the present invention.

FIG. 8 illustrates a schematic block diagram of a Class AB voltage-to-current converter 150 that includes a first transconductance stage 152, a second transconductance stage 154, a third transconductance stage 156, a fourth transconductance stage 158, and a fifth transconductance stage 160, each of which is coupled to receive a differential input voltage 162 and a bias voltage 164 from a biasing circuit 166. The biasing circuit 166 generates primary bias voltage 164 that is provided to each of the transconductance stages 152–160. In the described embodiment, the primary bias voltage 164 is greater for first transconductance stage 152 than for second transconductance stage 154 such that the first transconductance stage 152 becomes active before the second transconductance stage 154 with respect to the magnitude of differential input voltage 162. Similarly, a bias voltage received by third transconductance stage 156 is less than second transconductance stage 154, fourth transconductance stage 158 is less than third transconductance stage 156, and fifth transconductance stage 160 is less than fourth transconductance stage 158. Each higher numbered transconductance stage becomes active after the lower numbered transconductance stages.

Figure 12:
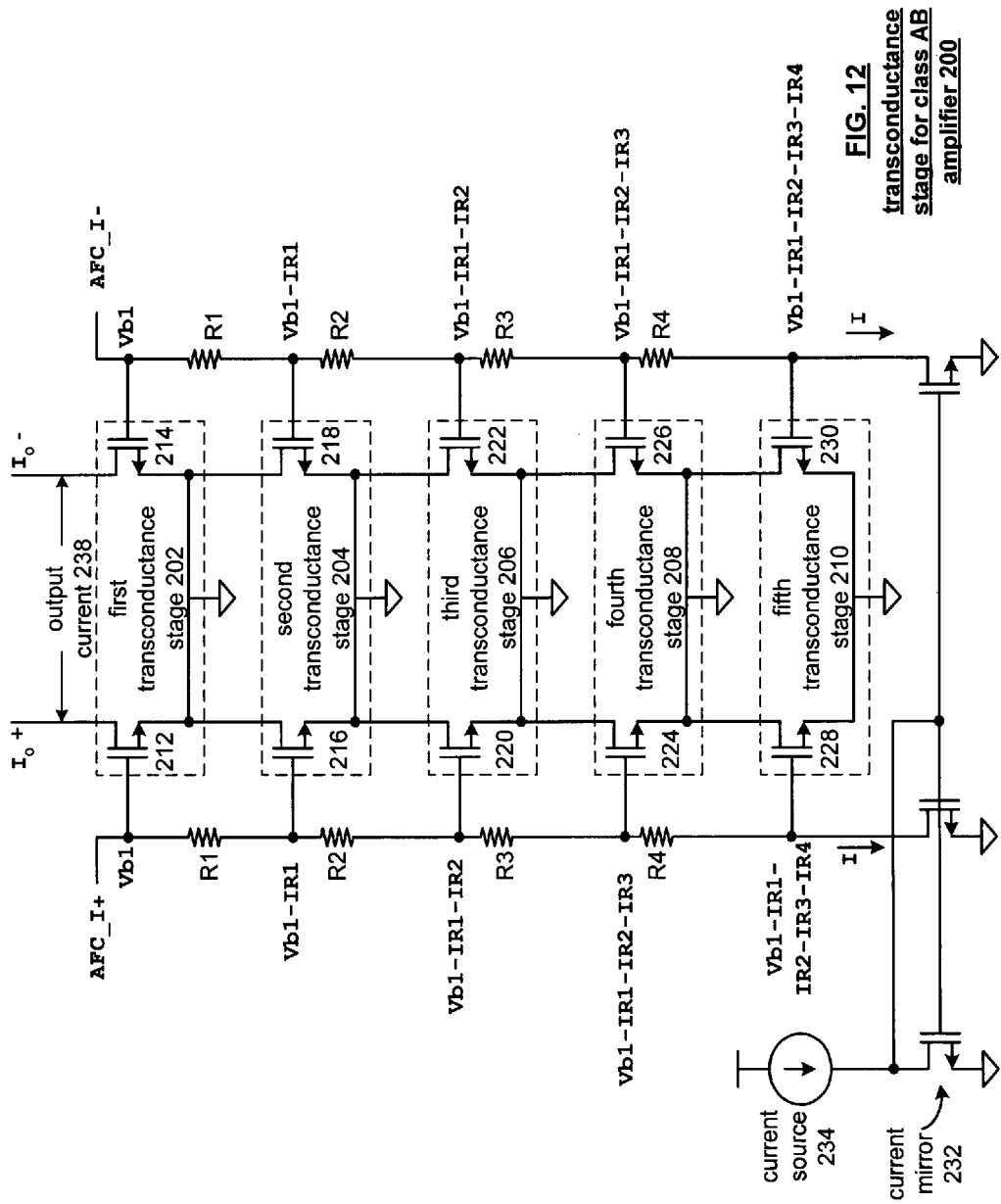
FIG. 12 illustrates a schematic block diagram of a Class AB amplifier in accordance with the present invention.

Many different embodiments may be implemented to achieve differing (sequentially lower) bias signal magnitudes to result in the differing biasing responses described above. In the embodiment shown, biasing circuit 166 produces the differing bias levels to each of the transconductance stages 152–160. Alternatively, as shown in relation to FIG. 12 as discussed below, biasing circuit 166 may produce one bias level that is reduced by a resistor ladder that defines a plurality of voltage drops to create the differing bias levels for the transconductance stages 152–160. In the embodiment of FIG. 12 as shown below, biasing circuit 166 produces a bias current that produces differing voltage drop levels across series coupled resistors of a resistor ladder having resistors coupled between the transconductance stages. The circuit of FIG. 12 includes a DC coupled path between the input and the transconductance elements. In one embodiment, the series coupled resistors have equal values. In another embodiment, the series coupled resistors have differing values. Each of the described topologies, however, are included within the example of FIG. 8.

In operation, each transconductance stage 152–160 of FIG. 8 is operably coupled to receive a differential input voltage 162. Based on the primary bias voltage 164, the first transconductance stage 152 converts the differential input voltage 162 into a primary differential current 168. The second transconductance stage 154 converts the differential input voltage 162 into a secondary differential current 170 based on the secondary bias voltage 164. Similarly, third transconductance stage 156 produces third differential current 172, fourth transconductance stage 158 produces fourth differential current 174, and fifth transconductance stage 160 produces fifth differential current 176. Each of the differential currents 168–176 is then summed. The sum of the differential currents 168–176 are produced as an output current 178.

The Class AB voltage-to-current converter 150 of FIG. 8 dynamically adds (or subtracts) the differential currents produced from second transconductance stage 154—fifth transconductance stage 160 from the differential current produced from first transconductance stage 152 to obtain a wider and more linear transconductance range. As such, the transconductance gain of each transconductance stage 152–160 are added based on the predefined offset voltages produced by biasing circuit 166. As differential input voltage 162 increases in magnitude, the subsequent transconductance stages 154–160 are turned on more strongly and broaden the effective transconductance linear range of converter 150.

As one of average skill in the art will appreciate, second transconductance stage 154 may effectively be subtracted from first transconductance stage 152 to compensate for ripple variations in the overall transconductance transfer function of converter 150. In such an instance, secondary differential current 170 would be subtracted from primary differential current 168 to produce output current 178. Operation for transconductance stages 156–160 in relation to first transconductance stage 152 is similar to second transconductance stage 154.

FIGS. 9 through 11 illustrate the DC values of the transconductance gain of the plurality of transconductance stages and the Class AB voltage-to-current converter operation of voltage-to-current converter 150 of FIG. 8. To obtain the overall transconductance (FIG. 11) of the converter, the transconductance (FIG. 10) of the second transconductance stage 154 is added to the transconductance (FIG. 9) of the first transconductance stage 152. The resulting overall transconductance has a much flatter transfer function than the transfer function of either of the stages independently. As is shown in FIG. 9, a peak-to-peak value of the transconductance of the first transconductance stage is in the range of 700 micro-Siemens, while the peak-to-peak overall value of the transconductance is in the range of 38 micro-Siemens according to simulated results for the inventive system as illustrated in FIGS. 9–11. If the overall transconductance is plotted in a scale similar to that of FIG. 9 for the first transconductance stage, the overall transconductance would clearly appear to be a relatively flat line. Thus, the overall transconductance behaves much more linearly than the transconductance stages illustrated in FIGS. 1 through 4, especially for large signals.

With respect to FIG. 10, four transconductance curves are shown for the second, third, fourth and fifth transconductance stages 154–160, respectively, for a specified voltage of interest (a differential +/−400 mV). Thus, for the voltage of interest range, the sum or overall transconductance is a relatively flat line with a ripple that is illustrated in FIG. 11. The transconductance curves of FIG. 10, generally, are a function of the differing DC bias levels and an input signal. As a very general description, the first transconductance stage is mostly on and the fifth transconductance stage is mostly off for a condition in which the bias signal is applied without any input signal. At an opposite extreme when the input signal is at a specified value, the fifth transconductance module may be mostly on while the first transconductance module is mostly off. For both cases, the remaining transconductance modules fall between these two endpoints based upon biasing levels. Accordingly, as the input signal swings, differing transconductance modules contribute the most output current wherein the sum output current of all five transconductance modules remains relatively linear as a function of the input signal magnitude.

FIG. 12 illustrates a schematic block diagram of a transconductance stage for a Class AB amplifier 200 that includes an embodiment of the biasing circuit 166 of FIG. 8 and an embodiment of each of the transconductance stages 152–160 of FIG. 8. Referring now to FIG. 12, between each of the transconductance stages 202–210 is coupled a resistor R1–R4, respectively. Similarly labeled resistors in FIG. 12 have similar values of resistance. These resistors, as coupled, form a resistive ladder to provide differing voltage bias levels for the corresponding transconductance modules 202–210 according to the values of R1–R4 and a current I. The biasing circuit includes a current source 234 and a current mirror shown generally at 232 that further includes a reference transistor that defines a current level for two mirroring transistors that sink current to produce a reference voltage source ($V_{ref}$) for each of the transconductance stages. The amount of current that is sunk by each mirror device is the current I that propagates through each of the resistors R1–R4. As may further be seen, current generated (sunk) by mirror devices of current mirror 232 is conducted through the plurality of resistors R1–R4 that form the resistor ladder and that create a bias voltage for each differential side of the first-fifth transconductance stages 202–210. The current that is sunk by the mirror devices is introduced into the circuit from the signal source that provides the AFC_I signal to the transconductance block of FIG. 12 in the described embodiment of the invention. Alternatively, such current may be provided by a current source coupled to the top of the transconductance block of FIG. 12.

As stated above, a voltage drop across each resistor R1–R4 creates a differing bias voltage for the corresponding transconductance stage 202–210. In one embodiment, the values of the resistors R1–R4 are equal. In an alternate embodiment, however, the values are selected to be different according to design preferences. One of average skill in the art may readily determine what such resistive values should be without undue experimentation. Moreover, differing bias values may also be obtained using different circuit configuration and topologies.

For example, offsets may be created by a diode, a battery, a biased transistor, etc., though resistors are utilized in the described embodiment.

More specifically, first transconductance stage 202 includes a $1^{st}$ transistor 212 and a $2^{nd}$ transistor 214. With no AFC_I input, the $1^{st}$ transistor 212 and $2^{nd}$ transistor 214 are operably coupled to receive one leg (e.g., $V_{b1}$) of the bias signal Each of these first and second transistors 212 and 214 are "DC" coupled for low frequency operation. As configured, first transconductance stage 202 produces primary differential current 168 (as shown in FIG. 8) from differential input voltage 162 (of FIG. 8) based on the primary bias voltage generated by the driving source. Accordingly, the primary bias voltage is set to a level that insures that for a small differential input voltage 162 a primary differential current 168 is produced.

Second transconductance stage 204 includes a $1^{st}$ transistor 216 and a $2^{nd}$ transistor 218. The gate voltage of transistors 216 and 218 is based on a voltage drop across R1 which is equal to $V_{b1} - IR_1$. When the gate threshold voltage of one of the transistors 216 and 218 is exceeded, second transconductance stage 204 generates secondary differential current 170. It is understood that this discussion is in absolute value terms and that the circuit operates in a differential manner consistent with this description.

Third transconductance stage 206 includes a $1^{st}$ transistor 220 and a $2^{nd}$ transistor 222. The gate voltage of transistors 220 and 222 is based on a voltage drop across R2 which is equal to $V_{b1} - IR_1 - IR_2$. When the gate threshold voltage of one of the transistors 220 and 222 is exceeded, third transconductance stage 206 generates third differential current 172 (as shown in FIG. 8).

Fourth transconductance stage 208 includes a $1^{st}$ transistor 224 and a $2^{nd}$ transistor 226. The gate voltage of transistors 224 and 228 is based on a voltage drop across R3 which is equal to $V_{b1} - IR_1 - IR_2 - IR_3$. When the gate threshold voltage of one of the transistors 224 and 226 is exceeded, fourth transconductance stage 208 generates fourth differential current 174 (as shown in FIG. 8).

Finally, fifth transconductance stage 210 includes a $1^{st}$ transistor 228 and a $2^{nd}$ transistor 230. The gate voltage of transistors 228 and 230 is based on a voltage drop across R4 which is equal to $V_{b1}-IR_1-IR_2-IR_3-IR_4$. When the gate threshold voltage of one of the transistors 228 and 230 is exceeded, fifth transconductance stage 210 generates fifth differential current 176 (as shown in FIG. 8).

For each of the above stages, the transconductance stage generates differential current whenever the gate threshold voltage, which is a total of the bias voltage and an input signal, exceeds a threshold value. Thus, with the DC biasing as described above, the instantaneous magnitude of the input signal affects the transconductance value and output current of the corresponding transconductance stage. For the input signal of interest (in this case AFC_I), the RC time constants are small such that each transconductance stage sees the approximately same magnitude AC signal (input signal) applied to its gates (exclusive of the bias voltage).

Output current 238 is the sum of the differential current produced by each of the transconductance stages. Note that when the gate voltage on transistors 216 and 218 have not exceeded their threshold voltage, no secondary differential current is produced by the second transconductance stage. Operation is similar for each of the third, fourth and fifth transconductance stages as well according to the bias levels defined by the resistors R1–R4. Thus, for relatively low differential input voltages, output current 238 is produced primarily by the differential current of first transconductance stage 202. As the magnitude of differential input voltage 162 of FIG. 8 increases, second transconductance stage 204 becomes active and generates the secondary differential current which is added to the primary differential current of first transconductance stage 202 to produce the resulting output current 238, which improves the overall transconductance and linearity of the amplifier 200.

As one of average skill in the art will appreciate, the transistors used in second transconductance stage 154 and the transistors used in first transconductance stage 152 may have the same size. This reduces process, offset, and temperature variation affects in the performance of the converter 200.

Figure 13:
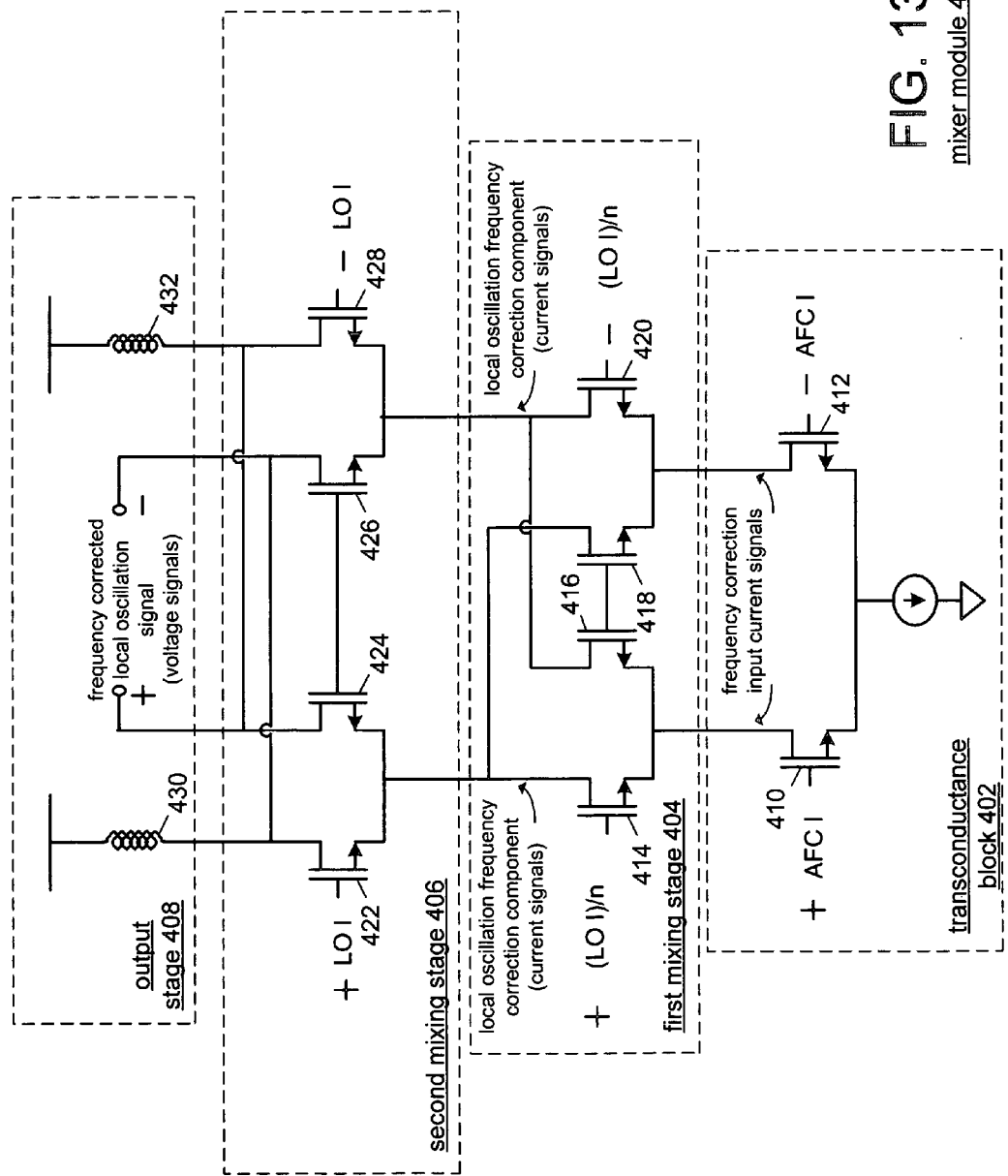
FIG. 13 illustrates a multi-stage mixer formed according to one embodiment of the invention.

FIG. 13 illustrates a multi-stage mixer formed according to one embodiment of the invention. The multi-stage mixer of FIG. 13 may also be used for the inventive circuit of FIGS. 6 and 7, as well as other applications in which a multi-stage mixer is beneficial. The multi-stage mixer 400 of FIG. 8 comprises a transconductance block 402 coupled to produce a current signal to a first mixing stage 404. FIG. 13 illustrates a traditional transconductance block 402 with only one differential pair for converting voltage to current. It is understood, however, that the sole differential pair of the first transconductance block is replaced by a multi-stage transconductance block exemplified in FIGS. 8 and 12. First mixing stage 404 of FIG. 13 produces a first mixed current signal to a second mixing stage 406. Second mixing stage 406 then produces a second mixed current signal to an output stage 408. More specifically, transconductance block 402 includes a pair of input devices 410 and 412 for receiving a differential input signal. The differential signal may be, for example, a frequency correction input originated by a digital processor such as a baseband processor. Input devices 410 and 412 convert the input voltage signal to current signals that are produced to first mixing stage 404. First mixing stage 404 includes two differential pairs of devices for mixing (multiplying) the current signals produced by the transconductance block with a divided local oscillation signal in the described embodiment (though the invention should be limited to the inputs shown). More specifically, a first differential pair of first mixing stage 404 includes devices 414 and 416, while a second differential pair of first mixing stage 404 includes devices 418 and 420. The sources of devices 414 and 416 are coupled to the drain of device 410, while the sources of devices 418 and 420 are coupled to the drain of device 412. The drains of devices 414 and 418 are coupled to provide a first input signal to second mixing stage 406, while the drains of devices 416 and 420 are coupled to provide a second input signal to second mixing stage 406. The gates of devices 416 and 418 are commonly coupled. Further, the first and second input signals jointly form the first mixed signal produced by first mixing stage 404.

Similarly, second mixing stage 406 comprises a first differential pair of devices 422 and 424 and a second differential pair of devices 426 and 428. The sources of devices 422 and 424 are commonly coupled to receive the first input signal produced by devices 414 and 418, while the sources of devices 426 and 428 are commonly coupled to receive the second input signal produced by devices 416 and 420. The gates of devices 424 and 426 are commonly coupled, while the gates of devices 422 and 428 are coupled to receive a local oscillation (the local oscillation being corrected in the described embodiment).

The drains of devices 422 and 426 are commonly coupled to produce a first output current signal to output stage 408, while the drains of devices 424 and 428 are commonly coupled to produce a second output current signal to output stage 408. Output stage 408 includes a first inductive load device 430 and a second inductive load device 432. Load device 430 is coupled to receive the first output current signal and load device 432 is coupled to receive the second output current signal. A differential output port is coupled to load devices 430 and 432 and to the drains of devices 422 and 426 and to the drains of devices 424 and 428, respectively. The first and second output current signals jointly form the second mixed signal.

In operation, the input devices of transconductance block 402 receive a frequency correction input (in one application of the inventive circuitry) and produce current signals to first mixing stage 404. The current signals produced by transconductance block 402 are multiplied with inputs received at the first mixing stage differential inputs. The resulting product from the multiplication is produced to second mixing stage 406 as current signals where they are multiplied with inputs received at the second mixing stage differential inputs. The resulting product from the second mixing stage is then produced to the output stage where the inductive load devices convert the output current signals into output voltage signals.

The described embodiments of the invention utilize inductive load devices though other devices may be used in other applications. The load devices may be, for example, resistive devices. The products produced at each mixing stage may, mathematically, be as described previously. Each input signal may be represented by a sine or cosine function according to whether it is an in-phase or quadrature phase input signal. Generally, though, the output signal will have a frequency component that is a sum of the local oscillation signal received at the second mixing stage, the divided local oscillation received at the first mixing stage and the frequency correction input signal received at the transconductance block.

FIG. 14 is a flowchart illustrating a method for producing a frequency compensated local oscillation signal for mixing with an RF signal or with a baseband or low intermediate frequency signal for down-converting or up-converting, respectively. In a Radio Frequency (RF) transceiver mixer module, a method for down-converting a received RF signal includes initially producing a baseband signal to a baseband processor (step 450) and receiving a frequency correction input therefrom (step 452). Until and before a steady state is reached, an uncompensated local oscillation is used to down convert a received RF signal. The baseband processor then determines an amount of necessary correction and provides the frequency correction input to the multi-stage mixer. Thereafter, the inventive process includes receiving an uncompensated divided local oscillation signal (step 454) and mixing the uncompensated divided local oscillation signal with the frequency correction input in a first mixing stage having a linearized output to produce a local oscillation frequency correction current signal component (step 456). The step of receiving the uncompensated divided local oscillation signal includes, in one embodiment, the step of dividing the undivided and uncompensated local oscillation signal to produce the uncompensated divided local oscillation signal. The local oscillation frequency correction current signal component is then produced directly to a second mixing stage without converting the output from a current signal to a voltage signal. Thus, the invention further includes receiving an undivided and uncompensated local oscillation signal (step 458) and mixing the undivided and uncompensated local oscillation signal with the local oscillation frequency correction current component in a second mixing stage to produce a frequency corrected local oscillation current signal (step 460). The local oscillation frequency correction component is produced to the second mixing stage without converting the local oscillation frequency correction component from the current domain to the voltage domain.

Finally, the invention includes converting the frequency corrected local oscillation signal to a voltage signal (step 462) to produce a frequency corrected local oscillation for mixing with a baseband or low IF signal to produce an up-converted RF signal or to produce a down-converted baseband or low IF signal. Thus, the invention, when used with a transceiver, includes mixing the frequency corrected local oscillation voltage signal with the received RF signal to produce the baseband signal without converting the local oscillation frequency correction component from the current domain to the voltage domain (step 464). Generally, the above two mixing steps occur without converting signals between the current and voltage domains.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

Moreover, the preceding discussion has presented a variety of embodiments of a Class AB voltage-to-current converter, as well as typical applications of the same. Such embodiments, by including one or more transconductance stages, improves the linear performance of a converter, which may be used in operational amplifiers, drivers, buffers, etc. As one of average skill in the art will appreciate, other embodiments may be derived from the teachings of the present invention, without deviating from the scope of the claims.

What is claimed is:

1. A class AB transconductance block, comprising:
   a first transconductance stage comprising MOSFET amplification devices operably coupled to produce a first differential current from a differential input voltage based on a first bias voltage;
   a second transconductance stage comprising MOSFET amplification devices operably coupled to produce a second differential current based on the differential input voltage and a second bias voltage;
   a third transconductance stage comprising MOSFET amplification devices operably coupled to produce a third differential current based on the differential input voltage and a third bias voltage, wherein output current of the class AB transconductance block is a sum of the first differential current, the second differential current and the third differential current; and
   a resistor ladder operable as a biasing circuit operably coupled to produce the first bias voltage, the second bias voltage and the third bias voltage, wherein the first bias voltage is greater than the second bias voltage and wherein the second bias voltage is greater than the third bias voltage and wherein each bias voltage for each of the transconductance stage is produced from an output end of a resistor of the resistor ladder.

2. The class AB transconductance block of claim 1, wherein the first transconductance stage further comprises:
   a first transistor operably coupled to receive a combination of a first leg of the differential input voltage and the first bias voltage; and
   a second transistor operably coupled to receive a combination of a second leg of the differential input voltage and the first bias voltage, wherein the second transistor is operably coupled to the first transistor such that the first transistor produces a first leg of the first differential current and the second transistor produces a second leg of the first differential current.

3. The class AB transconductance block of claim 1, wherein the second transconductance stage further comprises:
   a first transistor operably coupled to receive a combination of a first leg of the differential input voltage and the secondary bias voltage; and
   a second transistor operably coupled to receive a combination of a second leg of the differential input voltage and the secondary bias voltage, wherein the second transistor is operably coupled to the first transistor such that the first transistor produces a first leg of the secondary differential current and the second transistor produces a second leg of the secondary differential current.

4. The class AB transconductance block of claim 3 further including a third transconductance stage, the third transconductance stage further comprising:
   a first transistor operably coupled to receive a combination of a first leg of the differential input voltage end the secondary bias voltage; and
   a second transistor operably coupled to receive a combination of a second leg of the differential input voltage and the secondary bias voltage, wherein the second transistor is operably coupled to the first transistor such that the first transistor produces a first leg of the secondary differential current and the second transistor produces a second leg of the secondary differential current.

5. The class AB transconductance block of claim 4 further including a fourth transconductance stage, the fourth transconductance stage further comprising:
- a first transistor operably coupled to receive a combination of a first leg of the differential input voltage and the secondary bias voltage; and
- a second transistor operably coupled to receive a combination of a second leg of the differential input voltage and the secondary bias voltage, wherein the second transistor is operably coupled to the first transistor such that the first transistor produces a first leg of the secondary differential current end the second transistor produces a second leg of the secondary differential current.

6. The class AB transconductance block of claim 5 further including a fifth transconductance stage, the fifth transconductance stage further comprising:
- a first transistor operably coupled to receive a combination of a first leg of the differential input voltage and the secondary bias voltage; and
- a second transistor operably coupled to receive a combination of a second leg of the differential input voltage and the secondary bias voltage, wherein the second transistor is operably coupled to the first transistor such that the first transistor produces a first leg of the secondary differential current and the second transistor produces a second leg of the secondary differential current.

7. The class AB transconductance block of claim 1, wherein the biasing circuit further comprises a reference current source operably coupled to a current mirror to produce a bias signal.

8. The class AB transconductance block of claim 1, further including:
- a biasing circuit, wherein the biasing circuit further comprises:
- a first reference voltage source operably coupled to produce the first bias voltage;
- a second reference voltage source operably coupled to produce the secondary bias voltage;
- a first resistive pair operably coupled to provide the first bias voltage to the first transconductance stage; and
- a second resistive pair operably coupled to provide the secondary bias voltage to the secondary transconductance stage.

9. The class AB transconductance block of claim 1 further comprises:
- a fourth transconductance stage operably coupled to produce a fourth differential current based on the differential input voltage and a fourth bias voltage, wherein output current of the class AB voltage current converter is the sum of the first differential current, the secondary differential current, and the third differential current, and the fourth differential current wherein the biasing circuit produces the fourth bias voltage, wherein the third bias voltage is greater than the fourth bias voltage.

10. The class AB transconductance block of claim 9 further comprises:
- a fifth transconductance stage operably coupled to produce a fifth differential current based on the differential input voltage and a fifth bias voltage, wherein output current of the class AB voltage current converter is the sum of the first differential current, the second differential current, the third differential current, the fourth differential current and the fifth differential current, wherein the biasing circuit produces the fifth bias voltage, wherein the fourth bias voltage is greater than the fifth bias voltage.

11. A class AB transconductance block, comprising:
- a first transconductance stage operably coupled to produce a first differential current from a differential input voltage based on a first bias voltage;
- a second transconductance stage operably coupled to produce a second differential current based on the differential input voltage and a second bias voltage, wherein output current of the class AB transconductance block is a sum of the first differential current and the secondary differential current;
- a resistor ladder comprising a plurality of resistors wherein at least one resistor is coupled between each transconductance stage of the class AB transconductance block; and
- wherein each transconductance stage is biased to a different voltage level relative to all other transconductance stages.

12. The class AB transconductance block of claim 11 further comprising a third transconductance stage.

13. The class AB transconductance block of claim 12 further comprising a fourth transconductance stage.

14. The class AB transconductance block of claim 13 further comprising at least five transconductance stages.

* * * * *